United States Patent [19]

Augst

[11] 4,297,659
[45] Oct. 27, 1981

[54] CRYSTAL FILTER STRUCTURE

[75] Inventor: Horst G. Augst, Skärholmen, Sweden

[73] Assignee: Telefonaktiebolaget L M Ericsson, Stockholm, Sweden

[21] Appl. No.: 102,032

[22] Filed: Dec. 10, 1979

[30] Foreign Application Priority Data

Dec. 20, 1978 [SE] Sweden .............................. 7813107

[51] Int. Cl.³ ...................... H03H 9/50; H03H 9/56; H03H 9/58; H03H 9/60
[52] U.S. Cl. .................................. 333/191; 310/348; 333/192
[58] Field of Search ............... 333/187, 188, 189, 190, 333/191, 192; 310/320, 321, 323, 348, 365–366

[56] References Cited

U.S. PATENT DOCUMENTS 3,209,178  9/1965  Koneval ........................... 333/187 X
3,553,458  7/1969  Curran et al. ..................... 333/189 X
3,916,490  11/1975 Sheahan et al. ................... 333/189 X

*Primary Examiner*—Marvin L. Nussbaum
*Attorney, Agent, or Firm*—Hane, Roberts, Spiecens & Cohen

[57] ABSTRACT

The invention relates to a crystal filter structure of polylithic type for realizing a filter with a number of links. The structure is formed by quartz crystal elements (21, R1, R2, 22, R3, R4, . . .) each containing two resonators (R1, R2) and associated electrode connections (301, 302, 311, 312). The quartz crystal elements are alternately arranged and fastened on mutual sides of a substrate plate (1), the resonators being galvanically connected through metallic layers (m21–23, m31–33, . . .) at one of the longitudinal edges of the substrate plate and the intermediate edge surface. The connections (312, 322, 332, 342, . . .) of the "hot" electrodes are suitably turned towards the substrate plate. The input and the output of the filter (A and B respectively) are arranged at the opposite placed short sides of the substrate plate and possible earth connections (0) are commonly connected through metallic layers (m01, m02, . . .) at the second longitudinal edge of the substrate plate.

6 Claims, 5 Drawing Figures

CRYSTAL FILTER STRUCTURE

FIELD OF THE INVENTION

The present invention relates to a crystal filter structure and more specifically to a structure of the so called two-deck design on mutual sides of a substrate plate to attain a high degree of miniaturization and an optimal signal path through the structure.

DESCRIPTION OF PRIOR ART

Quartz crystal filters have been long known for frequency filtering of, for example, telecommunication signals as an alternative to using conventional filters built of inductors and capacitors. The crystal filters are then built of quartz crystal elements on which individual resonators are formed which are interconnected to provide a filter function with certain desired characteristics. In general, the different kinds of filter structures can be distinguished as follows:

a. Descrete resonators, i.e. separated quartz crystal plates for each pair of electrodes;

b. Several resonators integrated on one single quartz crystal plate, the acoustic coupling between the resonators according to the known energy trapping principle being neglectable or of such a degree that the influence of the coupling on the filter characteristic can be compensated by means of optimization methods when performing the filter calculation.

So called polylithic crystal filters of the monolithic or bilithic type have been developed from the type being described under b with several coupled resonators where the acoustic coupling between the resonators is a desired design parameter. Both these types of filters are described, for example, in "The bilithic quartz-crystal filter", Journal of Science and Technology, Vol. 38, No. 2, 1971, pages 74–82. The above-mentioned crystal filter shows a structure with two quartz plates and two or more resonators on each plate arranged in parallel and placed towards each other on mutual sides of the plate, possibly with a separate metal screen between the plates.

It is previously known (see, for example, the U.S. Pat. No. 3,723,920) to form a crystal filter structure with a high degree of miniaturization by stacking a number, for example, three substrates in the shape of ceramics frames on top of each other, each frame carrying a crystal element containing, for example, two quartz resonators.

SUMMARY OF THE INVENTION

When building crystal filter structures, like other electronic components, miniaturization and rational manufacturing procedures are sought. At the same time the greatest possible distance between the filter input, the filter output and possible ground connections is aimed at, since it is important to be able to avoid, reduce or rearrange parasitic reactances, i.e. capacitances which can arise between the crystal elements and the capsule in addition with inductances formed by the lead-in wires. Therefore it is advantageous to be able to provide a structure giving great freedom regarding the possibility of choosing suitable positions for the connections of the resonator electrodes. The structure which is described below is a further development of the main idea behind the structure of polylithic crystal filters of the so called bilithic type and can be applied on crystal filters of the type being mentioned in the claim preamble.

One object of the present invention is to provide a crystal filter structure of the kind mentioned in the claim preamble, which gives an optimal distance between the filter input, the filter output and the ground connection in considering a high degree of miniaturization and influence of parasitic capacitances. The structure is then characterized as appears from the characterizing part of the parent claims.

BRIEF DESCRIPTION OF THE DRAWINGS

The invention will be described more in detail with reference to the accompanying drawings where.

PREFERRED EMBODIMENTS

Figure 1:
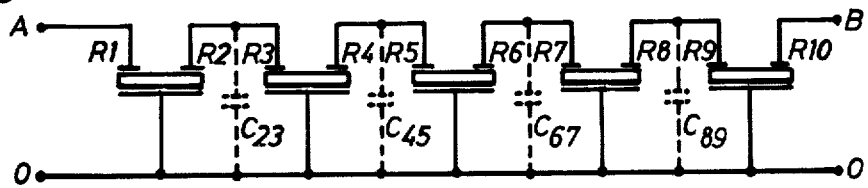
FIG. 1 shows a block diagram of a crystal filter with acoustically coupled resonators.

FIG. 1 shows a circuit diagram for a crystal filter being in this case built of five quartz crystal elements and containing the resonators R1–R10. Each quartz crystal element contains two acoustically coupled resonators, for example, R1, R2 included in the first element of the filter. The input and output of the filter are designated A and B respectively and furthermore there is a common ground connection designated O for each resonator R1–R10. This filter, according to the invention, is realized by means of the structure according to the FIGS. 2–5.

Figure 2:
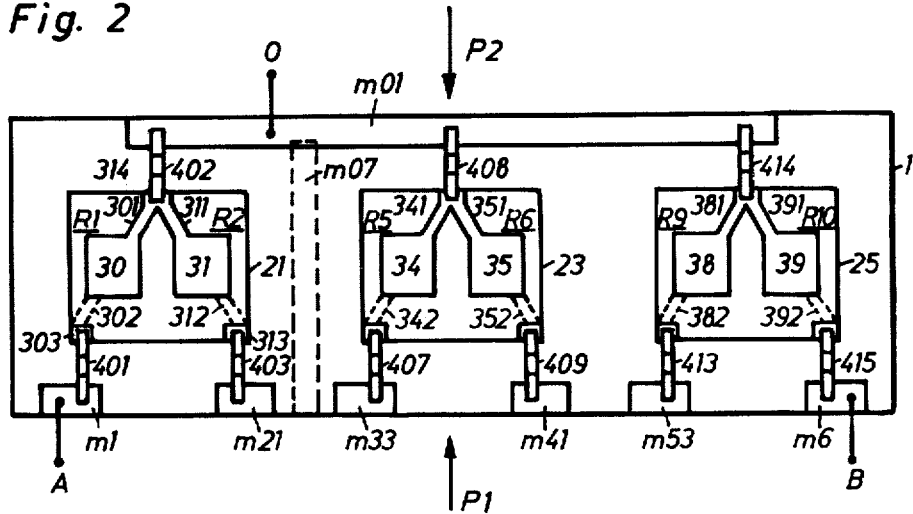
FIG. 2 shows the crystal filter structure according to the invention seen facing one of the main surfaces of a substrate plate.
Figure 3:
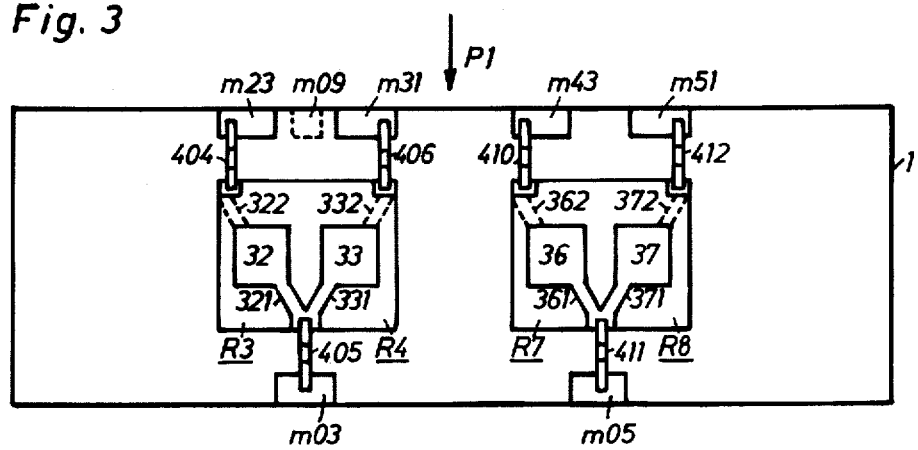
FIG. 3 shows the crystal filter structure according to the invention seen facing the second main surface of the substrate plate in FIG. 2.

FIGS. 2 and 3 show the structure seen when facing the first and the second main surfaces of a substrate, respectively in the shape of a rectangular ceramic plate 1 onto which five crystal elements corresponding to the elements according to FIG. 1 are arranged. A crystal element consists of a quartz plate, for example, the plate 21 in FIG. 2 together with two pairs of electrodes 30 and 31 of rectangular or otherwise suitable contour, which in a known manner are formed for example by means of vaporizing a metal in vacuum onto the plate 21. The upper and in FIG. 2 visible electrodes in each pair 30, 31 are galvanically connected with a metallized surface 314 at the edge of the quartz plate 21 through the connections 301 and 311 respectively. In similar manner, the lower (in FIG. 2 hidden) electrodes are galvanically connected with metallized surfaces 303 and 313 at the opposite edge of the plate 21 through the connection 302 and 312, respectively on the lower surface of the plate 21. The surfaces 303, 313 and 314 form the contact surfaces for connecting lead-in wires 401, 403 and 402, respectively as has been described in the Swedish patent application No 78.13108-3. The resonator R1 thus consists of the pair of electrodes 30 together with the connections 301, 302 and the resonator R2 consists of the pair of electrodes 31 together with the connections 311, 312. In a similar manner, the remaining resonators R3–R10 are integrated in pairs on the quartz plates 22–25 and connected through connections 321, 322 (the resonator R3), 331, 332 (the resonator R4) . . . 391, 392 (the resonator R10).

The substrate plate 1 is provided with conducting layers m1, m21, m33, m41, m53 and m6 along one of the longitudinal side edges and with a conducting layer m01 along the other of the longitudinal edges. The layers are provided on the substrate plate 1 for contact with a so called "beam-lead", for example, by means of thermal pressure welding in a manner known per se.

Figure 4:
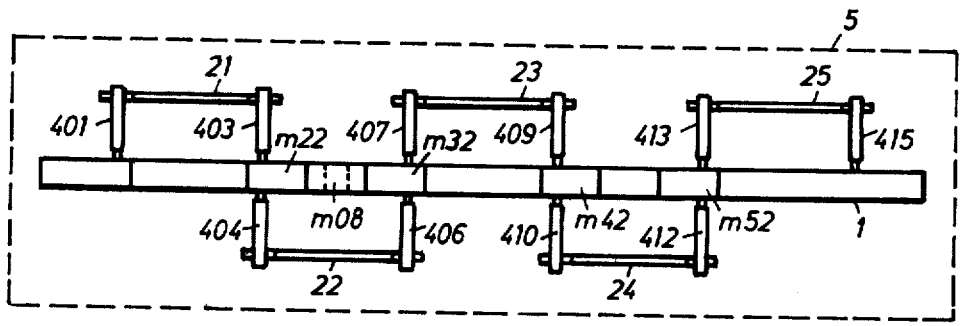
FIG. 4 shows a side view facing one of the edge surfaces of the substrate plate according to the FIGS. 2 and 3.
Figure 5:
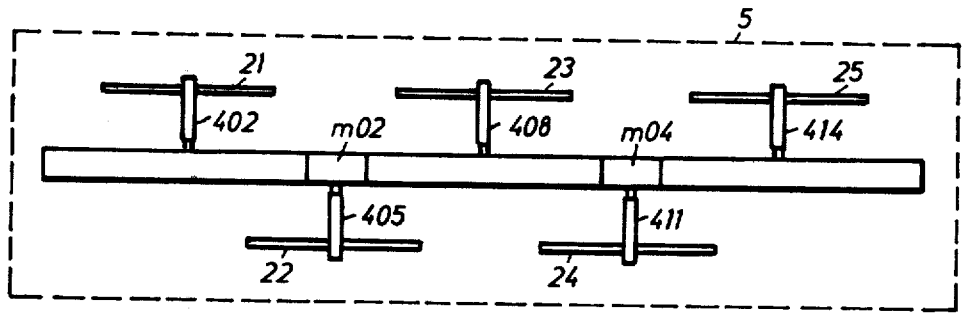
FIG. 5 shows a side view towards the second edge surface of the substrate plate.

FIGS. 4 and 5 show the structure facing the one and the other longitudinal edge surfaces, respectively of the substrate plate according to the arrows P1—P1 and P2—P2 respectively in the FIGS. 2 and 3. As can be seen the quartz plates 21-25 are arranged in so called two-deck performance, which implies saving of space the attainment of the highest possible degree of miniaturization. Along the edge surface of the substrate plate 1, conducting layers m22, m32, m42 and m52 are arranged in the same manner as the layers m21, m33, m41 and m53, the layer m22 being galvanically connected with the layer m21, the layer m32 galvanically connected with the layer m33 and so on. Furthermore the layers m22, m32, m42 and m52 are galvanically connected with the layers m23, m31, m43 and m51 respectively according to FIG. 3. As shown in FIG. 2, a common ground connection for the filter structure is provided by means of a metallic layer m01, which extends over such a long part of the one edge part of the substrate surface that connection of the lead-in wires 402, 408 and 414 is possible. The layer m01 is, according to FIG. 5 and FIG. 3, in conducting contact with the layers m02, m04 (FIG. 5) and the layers m03, m05, the last mentioned layers forming an ground connection for the lead-in wires 405, 411 at the resonators R3, R4 and R7, R8, respectively.

Consequently, it appears from the FIGS. 2-4 that the connection between two resonators, for example the resonators R2 and R3 which are not on the same quartz plate is carried out alternately from a resonator on one of a sides of the substrate plate 1 to the resonator on the other side of the substrate plate. In addition all so called "hot" electrodes in the resonators R1-R10, i.e. those electrodes which are not connected to ground 0, face the substrate plate 1 and are galvanically connected inside the two decks which are formed by the quartz plates 21-25. Thus the electrode capacitance between two subsequent resonators does not have any effect (the capacitance is short-circuited). Furthermore, the second electrode of each resonator is turned outwards from the substrate plate and connected to the ground-connected layers m01-m05 which are arranged on the opposite edge of the substrate plate 1 in relation to the layers m1, m21-m23, and so on, across which the "hot" electrodes are connected. The ground connection 0 according to FIG. 2 can simply be connected with a surrounding capsule indicated at 5 in the FIGS. 4 and 5, resulting in that the capacitance of the resonator electrodes to the capsule does not have any effect.

The signal path through the filter structure will be as follows:

The input A (the layer m1)→the resonators R1, R2→the layers m21, m22, m23→the resonators R3, R4→the layers m31, m32, m33→the resonators R5, R6→the layers m41, m42, m43→the resonators R7, R8 →the layers m51, m52, m53→the resonators R9, R10→the layer m6, i.e. the output B. The signal path will consequently be directed forward all the time, i.e. no reverse flow signals, which can cause parasitic capacitances.

The coupling capacitors $C_{23}$, $C_{45}$, $C_{67}$ and $C_{89}$, indicated with dashed lines in FIG. 1, the capacitor $C_{23}$, for example, can be connected between the resonators R2, R3 and ground 0 as indicated in FIG. 2 (dashed). A conducting layer m07 is disposed on the substrate plate 1 from the layer m01 up to the opposite edge of the plate and is eventually continued by means of the layer m08 across the edge surface to a conducting layer m09 on the opposite edge of the substrate plate 1, see FIGS. 3 and 4. The coupling capacitors can be of chip performance and the capacitors $C_{23}$, $C_{45}$ can be connected between the layers m08 and the layers m22 and m32, respectively or to the layers m07, m21, and m33, respectively, or to the layers m07, m21 and the layer m09 respectively or (reversely) between the layers m09, m23 and the layers m07 and m33, respectively. Possible appearing parasitic capacitances between the layers m08, m22, m32 and m07, m21, m33 and m09, m23, m31 can be neutralized by choosing a suitable value of the associated chip capacitor. In a similar way further coupling capacitors to other resonators can be connected.

What we claim is:

1. A crystal filter structure of the polylithic type for realizing a filter having at least three links connected in cascade, comprising an elongated substrate means and a plurality of crystal elements being arranged on the substrate means corresponding to the number of links, each element including a quartz plate with two acoustically coupled resonators where each resonator consists of a pair of electrodes on opposite sides of the quartz plate, and each element also including a first pair of interconnected electrode connections and a second pair of spaced electrode connections characterized in:

(a) that the crystal elements are alternately arranged in two planes, one plane opposite one side of the substrate means and the other plane opposite the other side of the substrate means, said planes forming a first and second deck;

(b) that the input of the filter is formed by the first electrode connection in said second pair of a first crystal element, said first crystal element being in the first deck and nearest one end of the substrate means, while the output of the filter is formed by the second connection in the second pair associated with that crystal element situated nearest to the other end of the substrate means; and (c) that the second electrode connection in said second pair associated with said first crystal element is connected to the first electrode connection in the second pair associated with a second crystal element, which is situated in the second deck and nearest to said first crystal element, the second electrode connection of the second crystal element being connected to one electrode connection of a third crystal element in the first deck and so on, so that the first electrode connection in said second pair of electrode connections of the last crystal element in the first or second deck is connected to the second electrode connection in the second pair associated with the last but one crystal element in the second and first deck, respectively.

2. Crystal filter structure according to claim 1, characterized in that the crystal elements in the two decks are so oriented that said first pair of electrode connections are directed towards the substrate means while said second pair of electrode connections is directed away from the substrate means.

3. Crystal filter structure according to claims 1 or 2, characterized in that said substrate means is a plate and said first pair of electrode connections is commonly connected through lead-in wires to metallic layers at the same edge of the two main surfaces of the substrate means and that the layers are galvanically connected through further metallic layers on the associated edge surface.

4. Crystal filter structure according to claim 3 characterized in that the connection between a resonator on the first crystal element in the first deck and a resonator on the second crystal element of the second deck is performed as a galvanic connection between a first metallic inlet, connected to said second electrode connection in the second pair, metallic layers on the two main surfaces of the substrate and an edge surface and a second metallic lead-in wire connected to said first electrode connection in the second pair of the second crystal element.

5. A crystal filter structure of the polylithic type comprising an elongated planar support means, first, second and third quartz plates, each including two acoustically coupled resonators, each resonator being defined by first and second electrodes on the first and second sides, respectively of a portion of a quartz plate, means for mounting said first and third resonators on one side of said planar support means, means for mounting said second resonator on the other side of said planar support means axially intermediate said first and second resonators, the first electrode of the first resonator of the first quartz plate being adapted to receive a signal, means for connecting the first electrode of the second resonator of said first quartz plate to the first electrode of the first resonator of said second quartz plate, and means for connecting the first electrode of the second resonator of said second quartz plate to the first electrode of the first resonator of said third quartz plate, and said first electrode of the second resonator of said third quartz plate being adapted to transmit a signal.

6. The filter structure of claim 5 wherein the first sides of said quartz plates face said planar support means and further comprising means for grounding the second electrodes of all of the resonators.

* * * * *